(12) United States Patent
Hsu

(10) Patent No.: US 6,406,985 B1
(45) Date of Patent: Jun. 18, 2002

(54) METHOD OF FABRICATING BURIED CONTACT

(75) Inventor: Shih-Ying Hsu, Hsinchu (TW)

(73) Assignee: United Microelectronics Corp., Hsinchu (TW)

( * ) Notice: Subject to any disclaimer, the term of this patent is extended or adjusted under 35 U.S.C. 154(b) by 10 days.

(21) Appl. No.: 09/728,674

(22) Filed: Dec. 1, 2000

(30) Foreign Application Priority Data

Nov. 15, 2000 (TW) ........................................ 89124131 A

(51) Int. Cl.[7] .............................................. H01L 21/74
(52) U.S. Cl. ...................................... 438/586; 438/592
(58) Field of Search ................................. 438/586, 592, 438/FOR 196

(56) References Cited

U.S. PATENT DOCUMENTS

| | | | |
|---|---|---|---|
| 5,053,349 A | * | 10/1991 | Matsuoka |
| 5,641,708 A | * | 6/1997 | Sardella et al. |
| 5,972,759 A | * | 10/1999 | Liaw |
| 6,001,681 A | * | 12/1999 | Liu et al. |
| 6,146,981 A | * | 11/2000 | Chen |
| 6,180,500 B1 | * | 1/2001 | Violette et al. |

* cited by examiner

Primary Examiner—Wael Fahmy
Assistant Examiner—Joannie Adelle Garcia
(74) Attorney, Agent, or Firm—Charles C. H. Wu; Wu & Cheung, LLP

(57) ABSTRACT

A method of fabricating a buried contact. On a substrate having a shallow trench isolation thereon, a gate oxide layer and a polysilicon layer are sequentially formed. The polysilicon layer and the gate oxide layer are patterned to expose a portion of the substrate. A diffusion region is formed in the exposed substrate. On the polysilicon layer and the exposed diffusion region, an amorphous silicon layer is formed. Consequently, a native oxide layer is formed between the polysilicon layer and the amorphous silicon layer, and between the amorphous silicon layer and the diffusion region. An anti-reflection coating layer is formed on the amorphous silicon layer. Using the native oxide layer as an etching buffer, the anti-reflection coating layer and the amorphous silicon layer are patterned until the diffusion region and the polysilicon layer are exposed. A spacer is formed on a sidewall of the patterned anti-reflection coating layer and the patterned amorphous silicon layer, while the exposed diffusion region is also covered thereby. Using the spacer and the patterned anti-reflection coating layer as a mask, the polysilicon layer and the gate oxide layer are etched until the substrate is exposed. A source/drain region is further formed in the exposed substrate.

19 Claims, 3 Drawing Sheets

METHOD OF FABRICATING BURIED CONTACT

CROSS-REFERENCE TO RELATED APPLICATION

This application claims the priority benefit of Taiwan application serial no. 89124131, filed Nov. 15, 2000.

BACKGROUND OF THE INTENTION

1. Field of the Invention

The invention relates in general to a method of fabricating a buried contact. More particularly, this invention relates to a method of fabricating a buried contact without formation of a micro-trench even when a misalignment occurs.

2. Description of the Related Art

To establish the contact between a drain region of a load device and other n-channel devices, a buried contact is often used to connect a diffusion region in a substrate and a polysilicon line. FIGS. 1A to 1C show a conventional method for fabricating such buried contact.

In FIG. 1A, on a substrate 100 having a shallow trench isolation 102, a gate oxide layer 104 and a polysilicon layer 106 are sequentially formed. A mask layer 108 with opening exposing a portion of the polysilicon layer 106, under which a buried contact is to be formed, is formed on the polysilicon layer 106.

In FIG. 1B, the exposed polysilicon layer 106 and the underlying portion of the gate oxide layer 104 are removed expose portion of the substrate 100. A diffusion region 110 is then formed in the exposed substrate 100. The mask layer 108 is removed to expose the polysilicon layer 106. Another polysilicon layer 112 is further formed on the exposed substrate 100 and the exposed polysilicon layer 106. A photoresist layer 114 to pattern a gate is then formed on the polysilicon layer 112. Ideally, the coverage of the photoresist layer 114 includes the polysilicon layer 112 aligned over the diffusion region 110.

In FIG. 1C, using the photoresist layer 114 as a mask, the exposed polysilicon layer 112 and the polysilicon layer 106 underlying the exposed polysilicon layer 112 are removed until the substrate 100 is exposed to form the gate. Being protected by the photoresist layer 114, the polysilicon layer 112 aligned over the diffusion region 100 is not removed. However, when an alignment offset occurs between the photoresist layer 108 and the photoresist layer 114, the photoresist layer 114 is not exactly aligned all over the diffusion region 110, a portion of the polysilicon layer 112 over the diffusion region 110 is exposed. During the step of patterning the gate, as the substrate 100 comprises a gate oxide layer 104 thereon an etching buffer, the substrate 100 is not damaged or etched away. However, the diffusion region 110 does not have a gate oxide layer 104, so that the diffusion region 110 is subject to the etching environment of the polysilicon layers 112 and 106. The diffusion region 110 is thus very easily damaged to form a micro-trench 116 as shown in FIG. 1C.

Therefore, in the conventional fabrication process, one a misalignment or an alignment offset occurs, a mirco-trench is easily formed in the buried contact to cause a disconnect between the polysilicon layer 112 and the diffusion region, and to seriously affect the performance of devices.

SUMMARY OF THE INVENTION

The invention provides a method of fabricating a buried contact. On a substrate having a shallow trench isolation thereon, a gate oxide layer and a polysilicon layer are sequentially formed. The polysilicon layer and the gate oxide layer are patterned to expose a portion of the substrate. A diffusion region is formed in the exposed substrate. On the polysilicon layer and the exposed diffusion region, an amorphous silicon layer is formed. Consequently, a native oxide layer is formed between the polysilicon layer and the amorphous silicon layer, and between the amorphous silicon layer and the diffusion region. An anti-reflection coating layer is formed on the amorphous silicon layer. Using the native oxide layer as an etching buffer, the anti-reflection coating layer and the amorphous silicon layer are patterned until the diffusion region and the polysilicon layer are exposed. A spacer is formed on a sidewall of the patterned anti-reflection coating layer and the patterned amorphous silicon layer, while the exposed diffusion region is also covered thereby. Using the spacer and the patterned anti-reflection coating layer as a mask, the polysilicon layer and the gate oxide layer are etched until the substrate is exposed. A source/drain region is further formed in the exposed substrate.

In the method mentioned above, the first conductive layer (the polysilicon layer) and the second conductive layer (the amorphous layer) are removed in two different etching steps. While etching the etching conductive layer, that is, the amorphous silicon layer, the native oxide formed on the diffusion region and the polysilicon layer function as an etching buffer, so as to protect the underlying polysilicon layer and the diffusion region. While performing another etching step to remove the polysilicon layer to form the gate, the substrate is protected by the gate oxide layer, while the diffusion region is covered with a portion of the spacer. Again, the substrate and the diffusion regions are not damaged during the etching step. Therefore, the micro-trench formed in the conventional method is avoided in the invention, and the device performance can be maintained as required.

Both the foregoing general description and the following detailed description are exemplary and explanatory only and are not restrictive of the invention, as claimed.

DESCRIPTION OF THE PREFERRED EMBODIMENTS

Figure 1A:
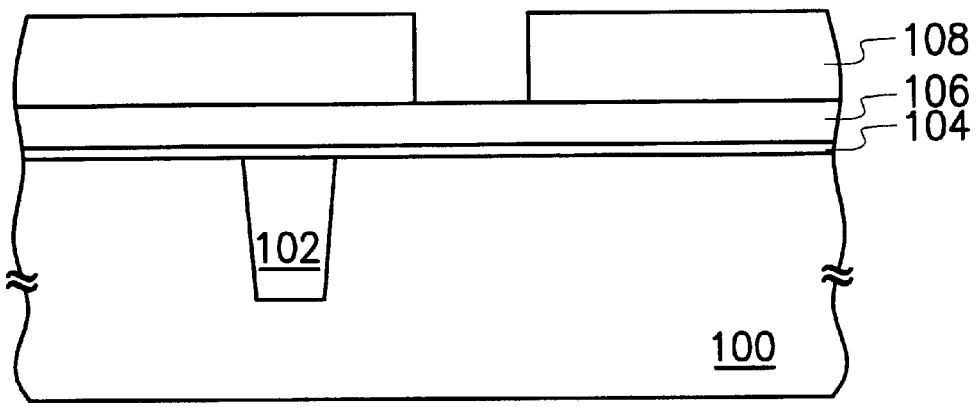
FIGS. 1A to 1C are cross sectional views showing a conventional method of fabricating a buried contact.
Figure 1B:
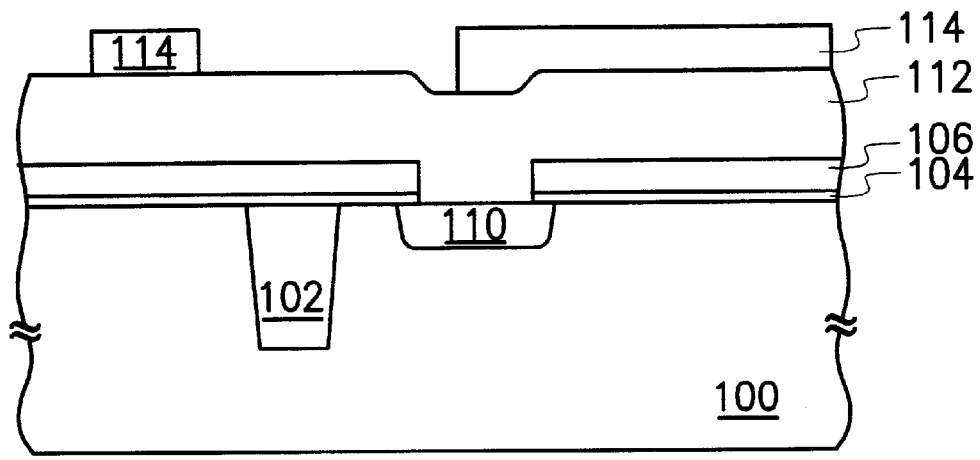

Referring to FIG. 2A to FIG. 2D, an embodiment which provides a method of fabricating a buried contact is illustrated. In FIG. 1A, a semiconductor substrate 200 having a shallow trench isolation 202 is provided. A gate oxide layer 204 and a polysilicon layer 206 are formed on the substrate 200. Preferably, the polysilicon layer 206 is formed with a thickness of about 500 angstroms. A buried contact (BC) mask layer 208 is formed on the polysilicon layer 208. The mask layer 208 comprises an opening exposing a portion of the polysilicon layer 208 under which a buried contact is to be formed. Using the mask layer 208 as a mask, the polysilicon layer 206 and the gate oxide layer 204 are etched until a portion of the substrate 200 is exposed.

Figure 2A:
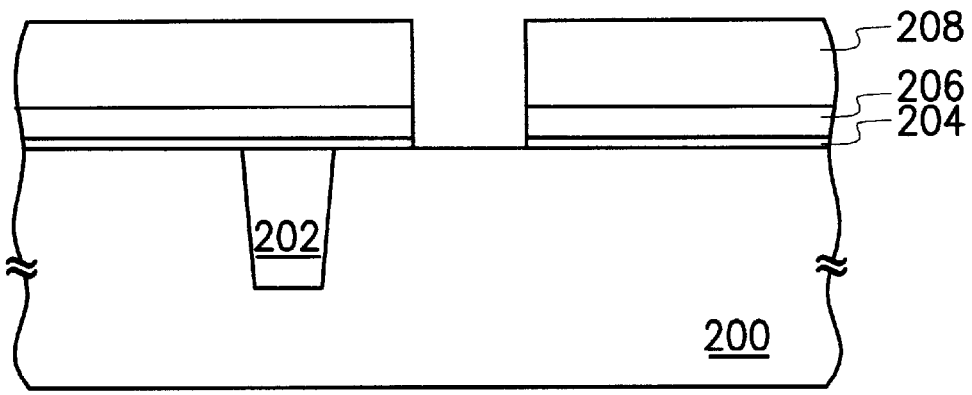
FIG. 2A to FIG. 2E are cross sectional views showing a method of fabricating a buried contact according to the invention.
Figure 2B:
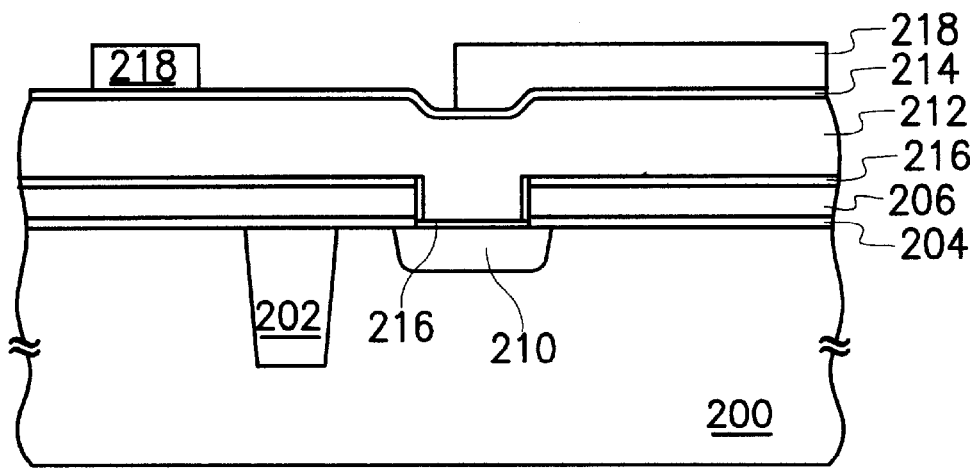

In FIG. 2B, using ion implantation, a diffusion region 210 is formed in the exposed substrate 200. The mask layer 208 is removed to expose the remaining polysilicon layer 206.

Figure 2C:
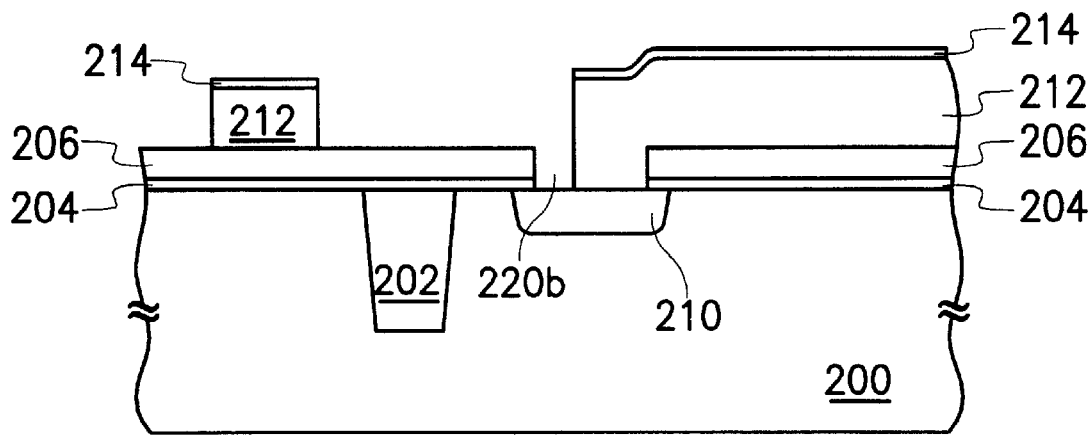

An amorphous silicon layer 212 with a thickness of about 1000–2000 angstroms is formed on the exposed polysilicon layer 206 and the exposed diffusion region 210. The amorphous silicon layer 212 includes an in situ doped N-type amorphous silicon layer. Or alternatively, when the polysilicon layer 206 is undoped, the amorphous silicon layer 212 can also be replaced with an in-situ doped N-type polysilicon layer. As a result, in the subsequent etching process, the etching rate of the amorphous silicon layer 212 much faster than that of the polysilicon layer 206. The polysilicon layer 206, a portion of the diffusion region 210 and the region 220 as shown in FIG. 2C can thus be used as an etch stop without being etched while etching the amorphous silicon layer 212 using the photoresist layer 218 as a mask. An anti-reflection coating layer 214 is further formed on the amorphous silicon layer 212. In addition, when the amorphous silicon layer 212 (or polysilicon layer) includes in situ doped amorphous silicon layer, the diffusion region 210 can be formed via a diffusion of the dopant contained in the amorphous silicon layer 212. The anti-reflection coating layer 214 includes, for example, a silicon oxy-nitride, with a thickness of about 200–400 angstrom. The anti-reflection coating layer 214 and the amorphous silicon layer 212 are then patterned.

In this embodiment, a photoresist layer 218 is formed to cover the anti-reflection coating layer 212 at one side of the diffusion region 210, and a portion of the anti-reflection coating layer 212 at the other side of the diffusion region 210 where a gate is to be formed. Ideally, the photoresist layer 218 completely covers the anti-reflection coating layer 214 aligned over the diffusion region 210. That is, there is no alignment offset between the photoresist layer 218 and the photoresist layer 208. However, as the integration of integrated circuits gradually increases, and the devices shrink, an alignment offset is frequently seen during fabrication. To emphasize the effect of the invention when a misaligned occurs, the photoresist layer 218 is formed over only a portion of the diffusion region 210. That is, a portion of the anti-reflection coating layer 214 over the diffusion region 210 is exposed. It is appreciated that people of ordinary skill in the art that the method provided by the invention can be applied to fabricate a buried contact whether a misalignment occurs or not.

In FIG. 2C, using the photoresist layer 218 as a mask, the exposed anti-reflection coating layer 210 and the underlying amorphous silicon layer 212 are etched until a portion of the polysilicon layer 206 is exposed. Meanwhile, due to the alignment offset, a portion of the diffusion region 210 is exposed too. Back to FIG. 2B, before formation of the amorphous silicon layer 212, inevitably, a native oxide layer is formed on the exposed diffusion region 210 and the polysilicon layer 206. During this step of etching away the exposed anti-reflection coating layer 214 and the amorphous silicon layer 212, this native oxide layer 216 is thus functioning as an etching buffer to protect the polysilicon layer 206 and the diffusion region 210 from causing any excess etching or damage. The thickness of the native oxide layer 216 is about 4 angstroms to about 6 angstroms.

Figure 1C:
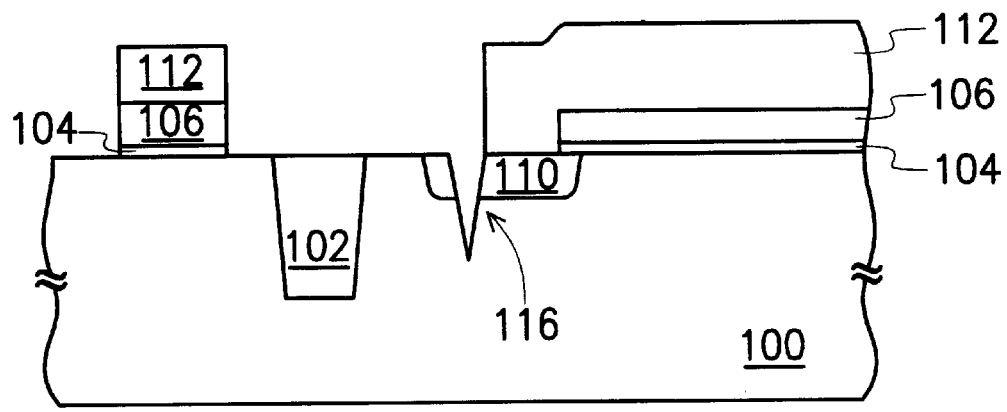
Figure 2D:
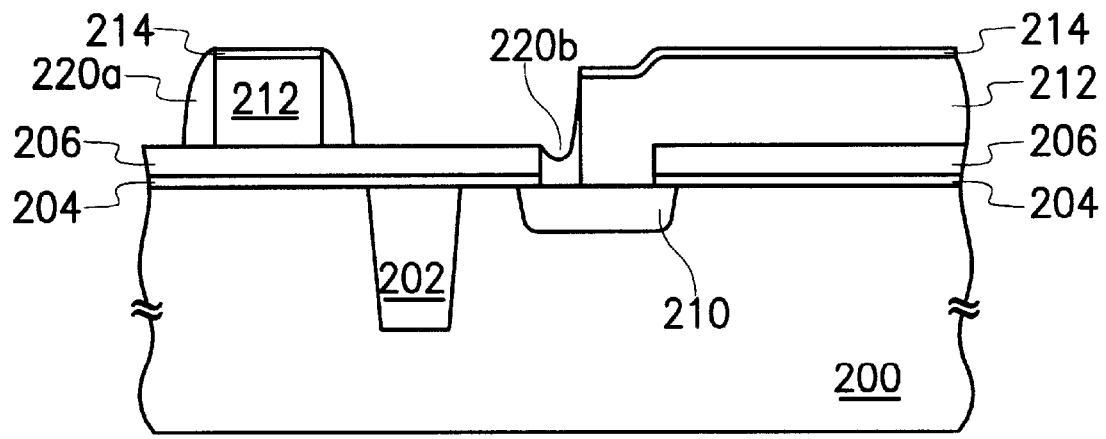

In FIG. 2D, a dielectric layer (not shown) is formed over the whole substrate 200. The dielectric layer is then etched back to form a spacer. The spacer comprises the spacer 220a on sidewall of the patterned anti-reflection coating layer 214 and the patterned amorphous silicon layer 212 on the polysilicon layer 206, and the spacer 220b to cover the exposed diffusion region 210. Therefore, the diffusion region 210 is protected from being etched or damaged in the subsequent etching process performed on the polysilicon layer 206, and the micro-trench as shown in FIG. 1C is not formed.

Figure 2E:
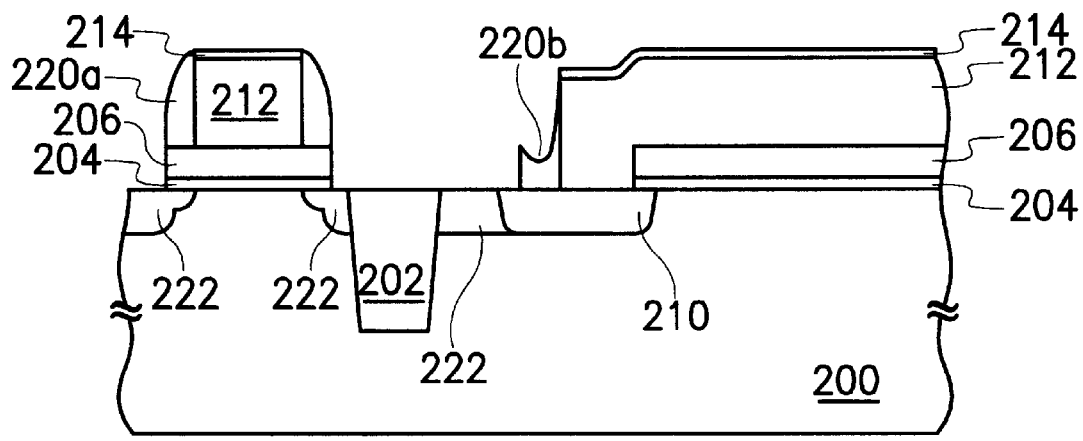

In FIG. 2E, using the patterned anti-reflection coating layer 214 and the spacers 220a and 220b as a mask, the exposed polysilicon layer 206 and the underlying gate oxide layer 204 are etched until the substrate 200 is exposed. As a result, an inverse T-shaped gate comprising the patterned gate oxide layer 204 and the patterned polysilicon layer 206 on substrate 200, a patterned amorphous silicon layer 212 on the polysilicon layer 206 and a spacer 220a on the sidewall of the amorphous silicon layer 212 is formed. Using the gate, the remaining anti-reflection coating layer 214 and the spacers 220a and 220b as a mask, a source/drain region is formed in the exposed substrate.

In addition to the above steps, steps of heavily doped ion implantation and annealing can further performed on the polysilicon layer 216 and the amorphous silicon layer 212, the amorphous silicon layer 212 can thus be re-crystallized. During the heavily doped ion implantation and the annealing steps, the very thin native oxide layer has been damaged without affecting the conductance of the amorphous silicon layer 212, the polysilicon layer 206 and the diffusion region 210.

Other embodiments of the invention will appear to those skilled in the art from consideration of the specification and practice of the invention disclosed herein. It is intended that the specification and examples to be considered as exemplary only, with a true scope and spirit of the invention being indicated by the following claims.

What is claimed is:

1. A method of fabricating a buried contact, the method comprising:

providing semiconductor substrate, the substrate comprising a shallow trench isolation;

forming a gate oxide layer on the substrate and a polysilicon layer on the gate oxide layer;

patterning the polysilicon layer and the gate oxide layer to expose a portion of the substrate;

forming a diffusion region in the exposed substrate;

forming an amorphous silicon layer on the polysilicon layer and the diffusion region;

forming an anti-reflection coating layer on the amorphous silicon layer;

patterning the anti-reflection coating layer and the amorphous silicon layer to expose a portion of the polysilicon layer;

forming a spacer on a sidewall of the patterned anti-reflection coating layer and the patterned amorphous silicon layer;

forming a gate by etching the exposed polysilicon layer and the underlying gate oxide layer until the substrate is exposed using the remaining anti-reflection coating layer and the spacer as a mask; and forming a source/drain region in the exposed substrate.

2. The method according to claim 1, wherein the step of forming a polysilicon layer comprises forming the polysilicon layer with a thickness of about 500 angstrom.

3. The method according to claim 1, wherein the step of forming an amorphous silicon layer comprises forming the amorphous silicon layer with a thickness of about 1000–2000 angstrom.

4. The method according to claim 1, wherein the step of forming the anti-reflection coating layer comprises forming the anti-reflection coating layer with a thickness of about 200–400 angstrom.

5. The method according to claim 1, wherein the step of forming an anti-reflection coating layer comprises forming a silicon oxy-nitride layer.

6. The method according to claim 1, wherein the step of forming a spacer comprises forming an oxide layer.

7. The method according to claim 1, wherein the step of forming a spacer comprises forming a nitride layer.

8. The method according to claim 1, comprising further the steps of performing ion implantation and annealing on the polysilicon layer and the amorphous silicon layer to re-crystallize the amorphous silicon layer.

9. The method according to claim 1, wherein the step of forming the amorphous silicon layer includes a step of forming an in situ N-type doped amorphous silicon layer.

10. The method according to claim 9, wherein the step of forming the diffusion region includes a step of diffusion dopants contained in the amorphous silicon layer to the semiconductor substrate.

11. A method of fabricating a buried contact, the method comprising:

providing a substrate, the substrate comprising at least a shallow trench isolation;

forming a gate oxide layer and a polysilicon layer on the substrate in sequence;

patterning the polysilicon layer and the gate oxide layer to expose a portion of the substrate;

forming a diffusion region in the exposed substrate;

forming an amorphous silicon layer on the polysilicon layer and the diffusion region, and consequently, forming a native oxide layer between the amorphous silicon layer and the diffusion region and between the amorphous silicon layer and the polysilicon layer;

forming an anti-reflection coating layer on the amorphous silicon layer;

patterning the anti-reflection coating layer and the amorphous silicon layer using the native oxide layer as an etching buffer until the polysilicon layer and the diffusion region are exposed;

forming a spacer on sidewall of the patterned anti-reflection coating layer and the patterned amorphous silicon layer, and to cover the exposed diffusion region;

using the patterned anti-reflection coating layer and the spacer as a mask to etch the polysilicon layer and the gate oxide layer until exposing the substrate; and forming a source/drain region in the exposed substrate.

12. The method according to claim 11, wherein the step of forming the spacer further comprises the following steps:

forming a dielectric layer on the patterned anti-reflection coating layer, the exposed polysilicon layer and the exposed diffusion region; and etching back the dielectric layer until the polysilicon layer is exposed.

13. The method according to claim 11, wherein the step of forming the polysilicon layer comprises forming the polysilicon layer with a thickness of about 500 angstrom.

14. The method according to claim 11, wherein the step of forming an amorphous silicon layer comprises forming the amorphous silicon layer with a thickness of about 1000–2000 angstrom.

15. The method according to claim 11, wherein the step of forming the anti-reflection coating layer comprises forming the anti-reflection coating layer with a thickness of about 200–400 angstrom.

16. The method according to claim 11, wherein the step of forming an anti-reflection coating layer comprises forming a silicon oxy-nitride layer.

17. The method according to claim 11, wherein the step of forming a spacer comprises forming an oxide layer.

18. The method according to claim 11, wherein the step of forming a spacer comprises forming a nitride layer.

19. The method according to claim 11, comprising further the steps of performing ion implantation and annealing on the polysilicon layer and the amorphous silicon layer to re-crystallize the amorphous silicon layer.

\* \* \* \* \*